(12) United States Patent
Linewih et al.

(10) Patent No.: US 10,651,166 B2
(45) Date of Patent: May 12, 2020

(54) E-FUSE CELLS

(71) Applicant: Globalfoundries Singapore Pte. Ltd., Singapore (SG)

(72) Inventors: Handoko Linewih, Singapore (SG); Chien-Hsin Lee, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 378 days.

(21) Appl. No.: 15/609,566

(22) Filed: May 31, 2017

(65) Prior Publication Data

US 2018/0350796 A1    Dec. 6, 2018

(51) Int. Cl.
| H01L 27/02 | (2006.01) |
| H01L 23/525 | (2006.01) |
| H01L 27/06 | (2006.01) |

(52) U.S. Cl.
CPC ...... *H01L 27/0266* (2013.01); *H01L 23/5256* (2013.01); *H01L 27/0259* (2013.01); *H01L 27/0647* (2013.01)

(58) Field of Classification Search
CPC .......... H02H 9/04; H02H 9/041; H01L 27/02; H01L 27/06; H01L 27/112; G11C 7/24
USPC ................... 361/54–56, 225.7; 327/524–527
See application file for complete search history.

(56) References Cited

U.S. PATENT DOCUMENTS

| 7,271,988 | B2 | 9/2007 | Chung et al. |
| 7,881,028 | B2* | 2/2011 | Abou-Khalil ....... H01L 23/5256 361/56 |
| 8,009,397 | B2 | 8/2011 | Etherton et al. |
| 8,625,377 | B2* | 1/2014 | Rountree ................. G11C 7/00 365/225.7 |
| 9,112,346 | B2* | 8/2015 | Nassar ..................... H02H 9/02 |
| 9,940,986 | B2* | 4/2018 | Loiseau ................. G11C 5/005 |
| 2007/0053121 | A1* | 3/2007 | Chang .................... H02H 9/046 361/56 |
| 2007/0247772 | A1* | 10/2007 | Keppens ............. H01L 27/0266 361/56 |
| 2008/0204952 | A1* | 8/2008 | Hung ..................... H02H 9/046 361/56 |
| 2012/0020177 | A1* | 1/2012 | Lin ......................... G11C 17/16 365/225.7 |
| 2012/0081826 | A1* | 4/2012 | Chen ..................... G11C 17/16 361/104 |

* cited by examiner

*Primary Examiner* — Tuan T Dinh
(74) *Attorney, Agent, or Firm* — Thompson Hine LLP; Anthony Canale

(57) ABSTRACT

E-fuse cells and methods for protecting e-fuses are provided. An exemplary e-fuse cell includes an e-fuse having a first end coupled to a source node and a second end selectively coupled to a ground. Further, the exemplary e-fuse includes a selectively activated shunt path from the source node to the ground. Also, the exemplary e-fuse includes a device for activating the shunt path in response to an electrical overstress event.

4 Claims, 2 Drawing Sheets

E-FUSE CELLS

TECHNICAL FIELD

The technical field generally relates to semiconductor devices to semiconductor electrical fuse devices, i.e., e-fuses, and more particularly to the protection of e-fuses from accidental programming and electrical overstress (EOS) such as electric static discharge (ESD).

BACKGROUND

E-fuses may be utilized to repair integrated circuits after fabrication. E-fuses are generally preferred to laser fuses because e-fuses can be placed anywhere under the metal structure of a chip, thus potentially allowing for thousands of e-fuses to be used in a single chip. E-fuses are typically designed to break when a large electrical current passes through the e-fuses. By "blowing" these e-fuses during testing, technicians can monitor and adjust their functions to improve their quality, performance and power consumption without much human intervention.

However, e-fuses are susceptible to false programming due to electric overstress. Because the physical structure of an e-fuse is very small and fragile, a typical resistance may be about 100 ohms, and devices with such small resistance are sensitive to electrical static discharge and floating supply voltage that can reside inside an integrated circuit. Both electrical static discharge and floating supply voltage can potentially cause these electrical fuses to accidentally program themselves while in the manufacturing stage, system qualification phase, or during physical contact. Therefore, it is desirable in the art of e-fuse design to provide improved electric overstress protection, thereby increasing reliability and production yield.

In view of the foregoing, it is desirable to provide an e-fuse cell with protection from electric overstress. Furthermore, it is also desirable to provide a method for protecting an e-fuse that is cost effective and compatible with logic processing. Furthermore, other desirable features and characteristics will become apparent from the subsequent detailed description and the appended claims, taken in conjunction with the accompanying drawings and this background.

BRIEF SUMMARY

E-fuse cells and methods for protecting e-fuses are provided. An exemplary e-fuse cell includes an e-fuse having a first end coupled to a source node and a second end selectively coupled to a ground. Further, the exemplary e-fuse includes a selectively activated shunt path from the source node to the ground. Also, the exemplary e-fuse includes a device for activating the shunt path in response to an electrical overstress event.

In another exemplary embodiment, an e-fuse cell includes an e-fuse having a first end coupled to a source node and a second end selectively coupled to a ground. The exemplary e-fuse cell further includes a diode connected to the source node and the ground in parallel to the e-fuse to inhibit negative current flow across the e-fuse.

In yet another exemplary embodiment, a method for protecting an e-fuse is provided. The method includes coupling the e-fuse between a source node and a ground. Further, the method includes detecting an electrical overstress event. Also, the method includes activating a shunt path from the source node to the ground in response to detecting the electrical overstress event.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
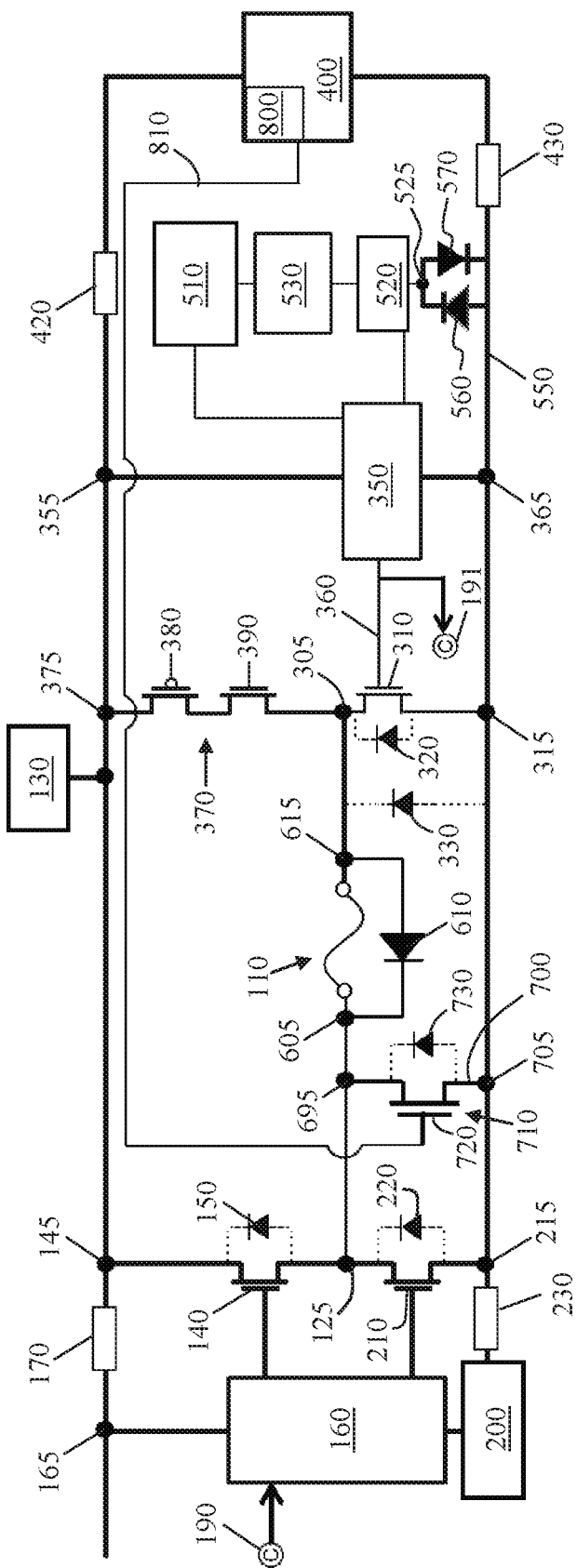
FIGS. 1 and 2 are circuit diagrams illustrating e-fuse cells in accordance with embodiments herein.

The following detailed description is merely exemplary in nature and is not intended to limit the e-fuse cells or methods for protecting e-fuses. Furthermore, there is no intention to be bound by any expressed or implied theory presented in the preceding technical field, background or brief summary, or in the following detailed description.

For the sake of brevity, conventional techniques related to conventional integrated circuit device fabrication and layout may not be described in detail herein. Moreover, the various tasks and processes described herein may be incorporated into a more comprehensive procedure or process having additional functionality not described in detail herein. Many conventional integrated circuit elements will only be mentioned briefly herein or will be omitted entirely without providing the well-known element details. Further, it is noted that integrated circuits include a varying number of components and that single components shown in the illustrations may be representative of multiple components.

Embodiments of the present disclosure generally relate to one-time programmable (OTP) memory cells, such as electronic fuses, or e-fuses. More specifically, embodiments herein provide for protection of e-fuses from electrical overstress (EOS). Electrical overstress occurs when a voltage/current, outside of a normal programming operation, is applied to the e-fuse and blows the e-fuse or otherwise changes the e-fuse programming state, such as by increasing the e-fuse resistivity to a state between logic 0 and logic 1. Electrical overstress is a phenomenon where electrical signals applied to a circuit or a device exceeds normal operating parameters or occurs outside of normal operation. These electrical signals are abnormal by definition and are not a part of normal operation of the devices. Electrical overstress is a major contributor to the damage of integrated circuit (IC) components. In the broadest terms, EOS also includes electrostatic discharge (ESD).

A typical electrical overstress event is a sharp narrow spike electrical signal. The voltage may be low, such as merely sufficient to partially drive the silicidation of the e-fuse to change the resistance of the e-fuse and alter the programming state of the e-fuse. The electrical overstress event can occur in circuit or out of circuit. Electrical overstress events include electrostatic discharge events that may have an extremely short duration, such as from one to one-hundred nanoseconds. Such events may cause agglomeration, such as a burst of salicide downward, and create voids in the e-fuse. As a result, the resistance value of the e-fuse is altered. While such electrostatic discharges may be in the kilovolt range, embodiments provided herein provide secondary stage protection, i.e., back-up or excess/reminder protection, from lower voltages, as the embodiments herein are intended for use in conjunction with chip level protection from higher voltage discharges. For example, higher level chip protection ESD devices may provide initial, first line, protection, but may not be 100% effective as such systems do not offer zero ohm resistance in shunting incoming ESD. A common danger of an ESD event is from a charged device model (CDM) in which the ESD can be a very narrow and very high current spike that discharged from nearby capacitive devices. For example, a ten amp discharge current that lasts one nanosecond going through an ESD protection device that has, at best, one ohm resistance results in a voltage build-up of ten volts.

FIG. 1 illustrates an e-fuse cell 100 with protection from EOS events in accordance with an embodiment herein. As shown, the e-fuse cell 100 includes an e-fuse 110. The e-fuse 110 has a first end or cathode coupled to a source node 125 (FSOURCE). As shown, the source node 125 is selectively coupled to a pad voltage source (VPP) 130. Specifically, the source node 125 is coupled to the voltage source 130 through a transistor 140, such as PMOS field effect transistor (PFET) 140, and node 145. Transistor 140 may be considered to be a pull up PFET. Transistor 140 could be an NFET, though such a choice would require a more complex control circuit design. As shown, a parasitic well junction diode 150 is provided across the PFET 140 between the source node 125 and the node 145.

As shown, the gate of the PFET 140 is coupled to a driver/controller 160 or control circuitry block 160. Controller 160 is also coupled to the voltage source 130 through node 165, metal connection resistance element 170, and node 145. It is noted that metal connection resistance element 170 is not an actual physical resistor device, but is illustrated in the schematic to indicate the possibility of long metal connection from pad voltage source (VPP) 130 to control circuitry block 160. Further, controller 160 is coupled to a ground (PVSS) 200.

The source node 125, which is the output of the driver or inverter, is also coupled to the ground 200 through a transistor 210, such as an NFET 210, and point 215. Controller 160 is coupled to the gate of the NFET 210. As shown, a parasitic well junction diode 220 is arranged across NFET 210 between the source node 125 and point 215. A metal connection resistance element ($R_{VPSS}$) 230 is illustrated as being coupled between ground 200 and the point 215. The metal connection resistance element 230 is not an actual physical resistor device, but is illustrated in the schematic to show the possibility of a long metal connection from the pad voltage source (VPP) 130 to ground 200.

The second end or anode of the e-fuse 110 is also selectively coupled to the ground 200. Specifically, the second end of the e-fuse 110 is connected to a select transistor drain node 305 to the ground 200, through select or switch selector transistor 310, point 315, point 215 and metal line resistance element 230. Switch selector transistor 310 may be an NFET 310. As shown, a parasitic well diode 320 is formed across NFET 310 between drain node 305 and point 315. Further, another parasitic diode 330 is coupled between the ground 200 and e-fuse 110.

The gate of the NFET 310 is coupled to a controller 350 or control block 350 by control line 360. Control line 360 is also connected to controller 160 through links 191 and 190, which are directly linked to one another. Links 190 and 191 are utilized in the schematic to simplify the representation, but could be replaced by a direct line connection between controller 160 and control line 360. As shown, the controller 350 is also coupled to the voltage source 130 through node 355. Also, the controller 350 is also coupled to the ground 200 through point 365. In an exemplary embodiment, controller 350 operates with voltage from voltage source 130, but has an input driven by a logic signal coming from logic circuitry (not shown). Therefore, controller 350 includes a level shifter and includes the connection to voltage source 130 and to logic voltage source (vdd) 510 described below.

The second end of the e-fuse 110 and the NFET 310 are also coupled to a sense amplifier 370, including a PFET 380 and NFET 390 in series, through drain node 305. The sense amplifier 370 is further coupled back to the voltage source 130 through node 375. An exemplary sense amplifier 370 includes comparator and latching circuitry. A full detailed description of the sense amplifier 370 is not shown and is not essential to the exemplary embodiment.

Further, the e-fuse cell 100 includes a power clamp 400 coupled to the voltage source 130 and the ground 200. Specifically, the power clamp 400 is coupled to the voltage source 130 through metal connection resistance element 420 and is coupled to the ground 200 through metal connection resistance element 430 and metal connection resistance element 230. As noted above, metal connection resistance elements 420 and 430 are not actual physical resistor devices, but are illustrated in the schematic to indicate the possibility of long metal connection from pad voltage source (VPP) 130 to control circuitry block 160. The location of the power clamp 400 will determine the value of metal resistance. For system design, it is highly desirable to locate primary ESD protection devices/circuits, such as ESD power clamp 400, at the periphery of the chip, away from main circuitries of the system. Further, the metal pad arrangement solely depends on the type of package choice. Hence, the placement of the metal connection resistance elements 170, 230, 420 and 430 are for general illustration purposes, as the existence of these metal parasitics depends on the package type and placement of the embedded e-fuse block.

As shown, the controller 350 is also coupled to a logic voltage source (vdd) 510 and a logic ground (vss) 520 that are also interconnected by a power clamp 530. In exemplary embodiments, every voltage source has a dedicated ESD power clamp. Further, the logic ground 520 is coupled at node 525 to the ground line 550 between metal connection resistance element 430 and point 365. As shown, the logic ground 520 is coupled to the ground line 550 by back to back diodes 560 and 570 to provide inter domain ESD protection.

During programming of the e-fuse 110, i.e., when selectively blowing the e-fuse 110, controller 160 turns PFET 140 on and turns NFET 210 off. Further, controller 350 turns switch selector NFET 310 on. As a result, a large current programming signal passes from the voltage source 130 to the source node 125 and through e-fuse 110 to the ground 200 through NFET 310. In this manner, the e-fuse 110 is programmed, i.e., blown. The exemplary e-fuse 110 is a one-time programmable (OTP) device. Therefore, a write mode/action is only performed one time, either during wafer sort or at package level processing. The schematic of the e-fuse cell 100 herein only describes write circuitry, because the failure of an e-fuse 110 relates to write action. NFET 310 acts as a shunting ground selector only on write mode to pass the program current through the e-fuse 110. Transistors 210 and 310 work in complementary action, depending on the mode (write or sense).

The exemplary e-fuse cell 100 is provided with further circuitry to avoid damage from electric overstress, such as an electrostatic discharge. For example, the exemplary e-fuse cell 100 is designed for use with positive current signals during testing. Typically, no negative current signals are used in testing. Thus, any negative current imposed on the e-fuse 110 is undesired. In order to avoid passage of a negative current across the e-fuse 110, a diode 610 is provided in parallel to the e-fuse 110 and connected at nodes 605 and 615 between nodes 125 and 305. As a result, a negative current will pass through diode 610 and bypass the e-fuse 110.

Also, in order to inhibit passage of undesired currents from electric overstress events across e-fuse 110, the e-fuse cell 100 is provided with a selectively activated shunt path 700 from the source node 125 to the ground 200. Specifically, the shunt path 700 is interconnected at node 695, between source node 125 and e-fuse 110, and at node 705 between ground 200 and point 315.

In the exemplary e-fuse cell 100 of FIG. 1, a transistor 710 such as a field effect transistor (FET), is located on the shunt path 700, with a source/drain connected to node 695 and a source/drain connected to point 705. In an exemplary embodiment, the transistor 710 is a NMOS field effect transistor (NFET). Further, the transistor 710 includes a gate 720 coupled to a device 800 for activating the shunt path 700, i.e., turning on transistor 710, in response to an electrical overstress event. Also, the e-fuse cell 100 includes a parasitic body diode 730 that is capable of shunting negative current coming from source node 125 direct to ground 200.

In the exemplary embodiment, the device 800 for activating the shunt path 700 is included in the power clamp 400. As with conventional power clamps used in protection circuits, power clamp 400 includes a resistor-capacitor (RC)-triggered electrostatic discharge (ESD) power clamp circuit 800. The RC-triggered ESD power clamp circuit 800 is an ESD protection circuit that can be incorporated into an integrated circuit (IC) chip to provide on-chip ESD protection for devices on the IC chip. The RC-triggered ESD power clamp circuit 800 operates to produce an RC-based signal in response to a positive ESD on a high voltage rail, e.g., a VDD rail. The power clamp 400 establishes a conduction path from the high voltage rail to a low voltage rail, e.g., a VSS rail, in response to the RC-based signal to route the ESD on the high voltage rail to the low voltage rail. In this fashion, the ESD is safely discharged to the low voltage rail so that devices connected to the high voltage rail are protected from the ESD, which may cause structural damage to the devices.

For purposes herein, the output 810, such as the RC-based signal, from the RC-triggered ESD power clamp circuit 800 is coupled to the gate 720 of the transistor 710. Thus, in response of the identification of an EOS, e.g., ESD, event by the power clamp 400 and the RC-triggered ESD power clamp circuit 800, the output 810 from the RC-triggered ESD power clamp circuit 800 activates the shunt path by turning on the transistor 710.

If the shunt path 700 were not provided in the e-fuse cell 100 of FIG. 1, then a current from an EOS event with sufficient voltage would cross the e-fuse 110 and pass through transistor 310 to reach the ground 200. Thus, the e-fuse cell 100 protects the e-fuse 110 from EOS events.

Figure 2:
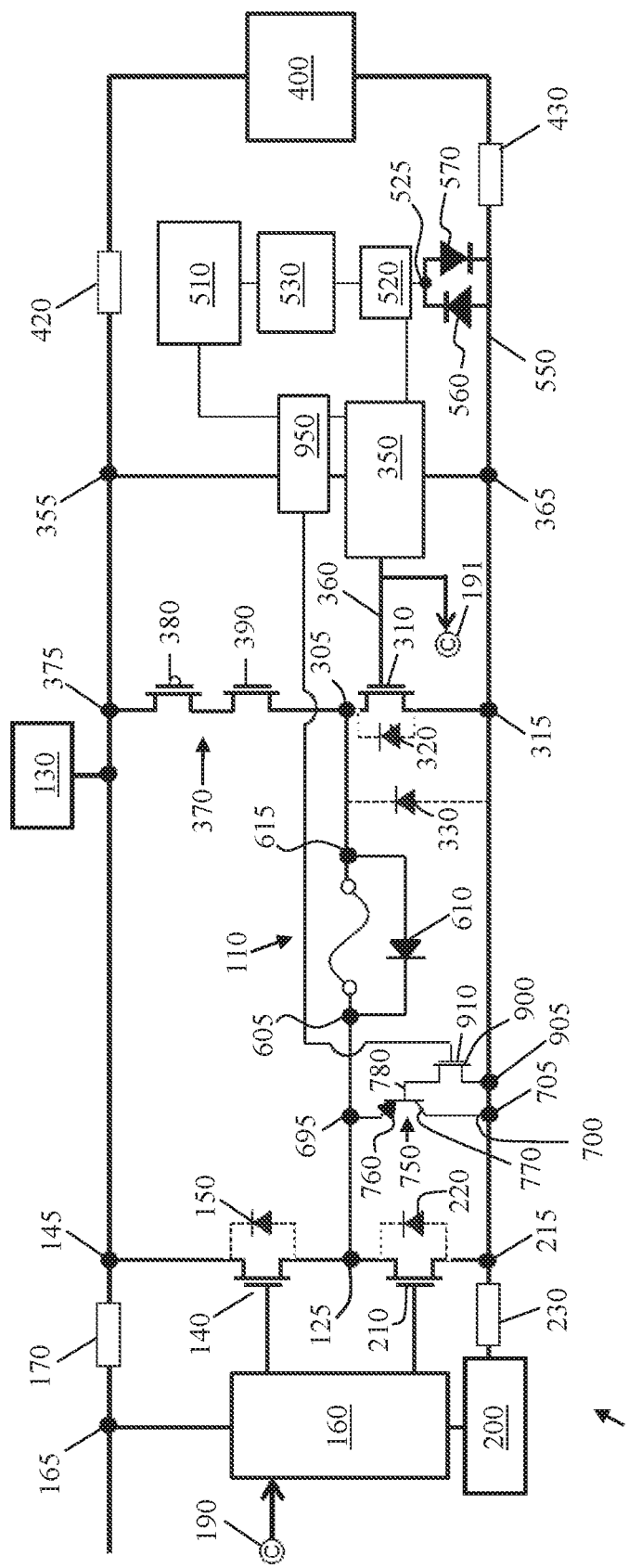

FIG. 2 illustrates another embodiment an of e-fuse cell 100 with protection from EOS events. As described above, the exemplary e-fuse cell 100 is designed for use with positive current signals during testing, and no negative current signals are typically used in testing. In order to avoid passage of a negative current across the e-fuse 110, a diode 610 is provided in parallel to the e-fuse 110 and connected at nodes 605 and 615 between nodes 125 and 305. As a result, a negative current will pass through diode 610 and bypass the e-fuse 110.

As shown, in order to inhibit passage of undesired currents from electric overstress events across e-fuse 110, the e-fuse cell 100 is provided with a selectively activated shunt path 700 from the source node 125 to the ground 200. Specifically, the shunt path 700 is interconnected at node 695, between source node 125 and e-fuse 110, and at node 705 between ground 200 and point 315.

In the exemplary e-fuse cell 100 of FIG. 2, a transistor 750, such as a bipolar junction transistor (BJT), is located on the shunt path 700, with an emitter 760 coupled to node 695 and a collector 770 connected to node 705. In an exemplary embodiment, the transistor 750 is a PNP BJT. Further, the transistor 750 includes a base 780 coupled to a small logic transistor 900. Specifically, the base 780 is coupled to a source/drain of the logic transistor 900. The source/drain of the logic transistor 900 is coupled to the ground 200 through node 905. Further, the logic transistor 900 has a gate 910 coupled to a device 950 for activating the shunt path 700, i.e., turning on logic transistor 900 and, in turn, turning on transistor 750, in response to an electrical overstress event. In the exemplary embodiment, the device 950 for activating the shunt path 700 is a controller/driver device 950.

As shown, controller/driver device 950 is connected to voltage source 130 through node 355. Further, controller/driver device 950 has an input side at logic level/control that is biased by logic source 510 and logic ground 520. In an exemplary embodiment, controller/driver device 950 is a "dummy" controller within no function during normal operation of the e-fuse cell 100. However, an EOS event triggers the controller/driver device 950 to activate the logic transistor 900. Normally controller/driver array out of the decoder circuit controls Write Line (WL) in selecting individual horizontal lines addressing, i.e., toggle ON/OFF of the horizontal array (Y) of e-fuses, i.e. control block 350. In an exemplary ESD/EOS event, such as an ESD qualification/test of the system in which ESD signals (positive/negative) are injected from each pads with respect to ground of other pads. Any combination of such inter-pad ESD testing, "zapping", can occur between injected pad of voltage source (VPP) 130 with respect to logic ground. During such testing, voltage may build up due to parasitic resistance or parasitic paths that could lead to activation of the decoder or of the driver of the decoder (located within the logic circuits section of controller 350). Unwanted activation of the decoder or of the driver of the decoder could activate the coupled NMOS 310 (selector FET), and could induce any path from the source side of the e-fuse 110 to flow to ground level through unwanted coupling or activation of NFET 310. In other words, unwanted activation of the WL, hence selector FET 310, could lead an unwanted stray of EOS/ESD current to pass through e-fuse 110.

Embodiments herein create another copied array of a controller/driver, in dummy controller/driver device 950, that is not connected to each of WL lines. Instead, dummy controller/driver device 950 is connected to control the activation of the logic transistor 900. Thus, dummy controller/driver device 950 is able to mimic the false activation due to an ESD/EOS event as in controller 350, and to activate the logic transistor 900 to inhibit any current from passing through the e-fuse 110. Controller/driver device 950 is "dummy" in the sense that controller/driver device 950 is just a copy array that has no input connected to address lines, but has connection to logic bias source and ground potential.

If the shunt path 700 were not provided in the e-fuse cell 100 of FIG. 2, then a current from an EOS event with sufficient voltage would cross the e-fuse 110 and pass through transistor 310 to reach the ground 200. Thus, the e-fuse cell 100 protects the e-fuse 110 from EOS events.

The embodiments as described result in protecting the e-fuse 110 from damage. Such damage may include moderate changes in resistivity of the e-fuse 110 or fully blowing the e-fuse 110. Further, the exemplary e-fuse cells 100 provide for localized protection of e-fuses 110. The embodiments described may be implemented in conjunction with larger EOS or ESD protection structures. Therefore, the embodiments described herein may provide for secondary protection of the e-fuse 110 only up to the current limit of the e-fuse 110, such as only up to about 10 mA.

The present disclosure may be embodied in other specific forms without departing from the spirit or essential characteristics thereof. The foregoing embodiments, therefore, are to be considered in all respects illustrative rather than limiting. While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. An e-fuse cell comprising:
   an e-fuse having a first end coupled to a source node and a second end selectively coupled to a ground;
   a selectively activated shunt path from the source node to the ground, wherein the e-fuse is not located between the source node and the ground on the shunt path;
   a device for activating the shunt path in response to an electrical overstress event;
   a PNP bipolar junction transistor in the shunt path and having an emitter coupled to the source node, a collector coupled to the ground, and a base; and
   a logic field effect transistor having a source coupled to the base of the PNP bipolar junction transistor, a drain coupled to the ground, and a gate,
   wherein the device for activating the shunt path in response to the electrical overstress event is coupled to the gate of the logic field effect transistor.

2. The e-fuse cell of claim 1 wherein the device for activating the shunt path in response to the electrical overstress event is a controller having an output coupled to the gate of the logic field effect transistor.

3. An e-fuse cell comprising:
   an e-fuse having a first end coupled to a source node and a second end selectively coupled to a ground;
   a selectively activated shunt path from the source node to the ground, wherein the e-fuse is not located on shunt path between the source node and the ground;
   a diode connected to the source node and the ground in parallel to the e-fuse to inhibit negative current flow across the e-fuse;
   a device for activating the shunt path in response to an electrical overstress event;
   a PNP bipolar junction transistor in the shunt path and having an emitter coupled to the source node, a collector coupled to the ground, and a base; and
   a logic field effect transistor having a source coupled to the base of the PNP bipolar junction transistor, a drain coupled to the ground, and a gate, wherein the device for activating the shunt path in response to the electrical overstress event is coupled to the gate of the logic field effect transistor.

4. The e-fuse cell of claim 3 wherein the device for activating the shunt path in response to the electrical overstress event is a controller having an output coupled to the gate of the logic field effect transistor.

\* \* \* \* \*